(12) United States Patent
Kim

(10) Patent No.: US 7,605,525 B2
(45) Date of Patent: Oct. 20, 2009

(54) PLASMA DISPLAY PANEL ASSEMBLY HAVING A SHORT CIRCUIT PREVENTIVE UNIT

(75) Inventor: Myoung-Kon Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 588 days.

(21) Appl. No.: 11/270,466

(22) Filed: Nov. 10, 2005

(65) Prior Publication Data
US 2006/0098398 A1 May 11, 2006

(30) Foreign Application Priority Data
Nov. 11, 2004 (KR) .................. 10-2004-0091862

(51) Int. Cl.
*H01K 1/58* (2006.01)
*H05K 7/20* (2006.01)

(52) U.S. Cl. ................. 313/46; 313/582; 361/704

(58) Field of Classification Search .......... None
See application file for complete search history.

(56) References Cited

U.S. PATENT DOCUMENTS 6,703,702 B2 * 3/2004 Inoue et al. .......... 257/684
7,394,185 B2 * 7/2008 Ahn et al. .......... 313/46
2004/0095727 A1 * 5/2004 Houle .......... 361/704
2005/0078446 A1 * 4/2005 Bae .......... 361/687
2005/0088093 A1 * 4/2005 Kim et al. .......... 313/582

FOREIGN PATENT DOCUMENTS

| JP | 04291999 | 10/1992 |
|---|---|---|
| JP | 10308484 | 11/1998 |
| JP | 2001352022 | 12/2001 |
| JP | 2002014625 | 1/2002 |
| JP | 2002351346 | 12/2002 |
| JP | 2003108017 | 4/2003 |
| JP | 2003115568 | 4/2003 |

* cited by examiner

*Primary Examiner*—Toan Ton
*Assistant Examiner*—Britt Hanley
(74) *Attorney, Agent, or Firm*—H.C. Park & Associates, PLC

(57) ABSTRACT

A plasma display panel (PDP) assembly including a PDP, a chassis base supporting the PDP, a driving circuit unit, a tape carrier package electrically coupling the PDP with the driving circuit unit, and including a driving integrated circuit (IC), and a short circuit preventive unit arranged between the chassis base and the tape carrier package and preventing the tape carrier package from short-circuiting.

12 Claims, 7 Drawing Sheets

PLASMA DISPLAY PANEL ASSEMBLY HAVING A SHORT CIRCUIT PREVENTIVE UNIT

CROSS-REFERENCE TO RELATED APPLICATION

This application claims priority to and the benefit of Korean Patent Application No. 10-2004-0091862, filed on Nov. 11, 2004, which is hereby incorporated by reference for all purposes as if fully set forth herein.

BACKGROUND OF THE INVENTION

1. Field of the Invention

The present invention relates to a plasma display panel (PDP) assembly, and more particularly, to a PDP assembly including a short circuit preventive unit for preventing a tape carrier package from short circuiting.

2. Discussion of the Background

Generally, a plasma display panel (PDP) assembly is a flat display device in which a plurality of discharge electrodes are formed on opposing substrates. A predetermined voltage is applied across a discharge space between the substrates to generate a discharge, which excites discharge gas to emit ultraviolet rays. The ultraviolet rays excite a fluorescent layer, which emits visible light as its energy level decreases.

The PDP assembly may be manufactured by separately producing and then combining a front panel and a rear panel. A chassis base is installed behind the combined panels, and a driving circuit unit, which transmits electric signals between the panels and the driving circuit unit, is mounted on the rear of the chassis base. Then, the resultant structure is installed inside a case after a testing process.

Referring to FIG. 1, a conventional PDP assembly 100 includes a PDP 101 having a front panel 102 and a rear panel 103 coupled with the front panel 102, a chassis base 104 adhered to a rear surface of the PDP 101 by an adhesive member 105 and supporting the PDP 101, a cover plate 106 installed at top and bottom portions of the chassis base 104, and a tape carrier package 107 arranged between the chassis base 104 and the cover plate 106. The tape carrier package 107 includes a driving integrated circuit (IC) 108 and a flexible film 109 covering a lead connected to the driving IC 108.

In the conventional PDP assembly 100, the PDP 101 generates heat during operation. The heat may be dissipated to the outside through the chassis base 104 via the adhesive member 105, which functions as a heat conductive medium.

Here, the driving IC 108 of the tape carrier package 107 also generates heat during operation. The heat generated from the driving IC 108 may be dissipated to the outside through an end 104a of the chassis base 104 and the cover plate 106.

However, the conventional PDP assembly 100 may experience the following problems.

Since the driving IC 108 generates a considerable amount of heat while the PDP assembly 100 operates, if the heat is not sufficiently dissipated to the outside, the driving IC 108 may be damaged due to overheating.

To prevent this situation, the chassis base 104 may be formed contacting a side of the tape carrier package 107, and the cover plate 106 applies a predetermined pressure to the other side of the tape carrier package 107 with a heatproof sheet 110 arranged therebetween.

However, since the pressure transmits to the film 109, the end 104a of the chassis base 104 and the film 109 may interfere with each other. Consequently, curves or foreign matter of the chassis base 104 may rip the film 109, thereby resulting in the film 109 being disconnected or short circuiting.

Furthermore, a raw aluminum material is blanked and formed to fabricate the aluminum chassis base 104. Then, the aluminum material is leveled and cut. Strong pressure is applied to the aluminum material during the fabrication process. Thus, conductive foreign matter may be generated in the aluminum material. If the conductive foreign matter remains on a surface of the tape carrier package 107 contacting the chassis base 104, the film 109 may short-circuit, particularly if it is ripped.

SUMMARY OF THE INVENTION

The present invention provides a plasma display panel (PDP) assembly including a short circuit preventive unit arranged between a chassis base and a tape carrier package to prevent the tape carrier package from short-circuiting.

The present invention also provides a PDP assembly including a heat conductive medium in a short circuit preventive unit to quickly dissipate heat generated from the driving IC to the outside.

Additional features of the invention will be set forth in the description which follows, and in part will be apparent from the description, or may be learned by practice of the invention.

The present invention discloses a PDP assembly including a PDP, a chassis base supporting the PDP, a driving circuit unit coupled with a rear surface of the chassis base, a tape carrier package electrically coupling the PDP with the driving circuit unit, and including a driving integrated circuit (IC), and a short circuit preventive unit arranged between the chassis base and the tape carrier package and preventing the tape carrier package from short-circuiting.

The present invention also discloses a PDP assembly including a chassis base supporting a PDP, a cover plate arranged behind and on a side of the chassis base to be separated from the chassis base by a predetermined distance, a tape carrier package arranged between the chassis base and the cover plate, and comprising a driving IC, and a short circuit preventive unit arranged between the chassis base and the tape carrier package and preventing the tape carrier package from short-circuiting.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
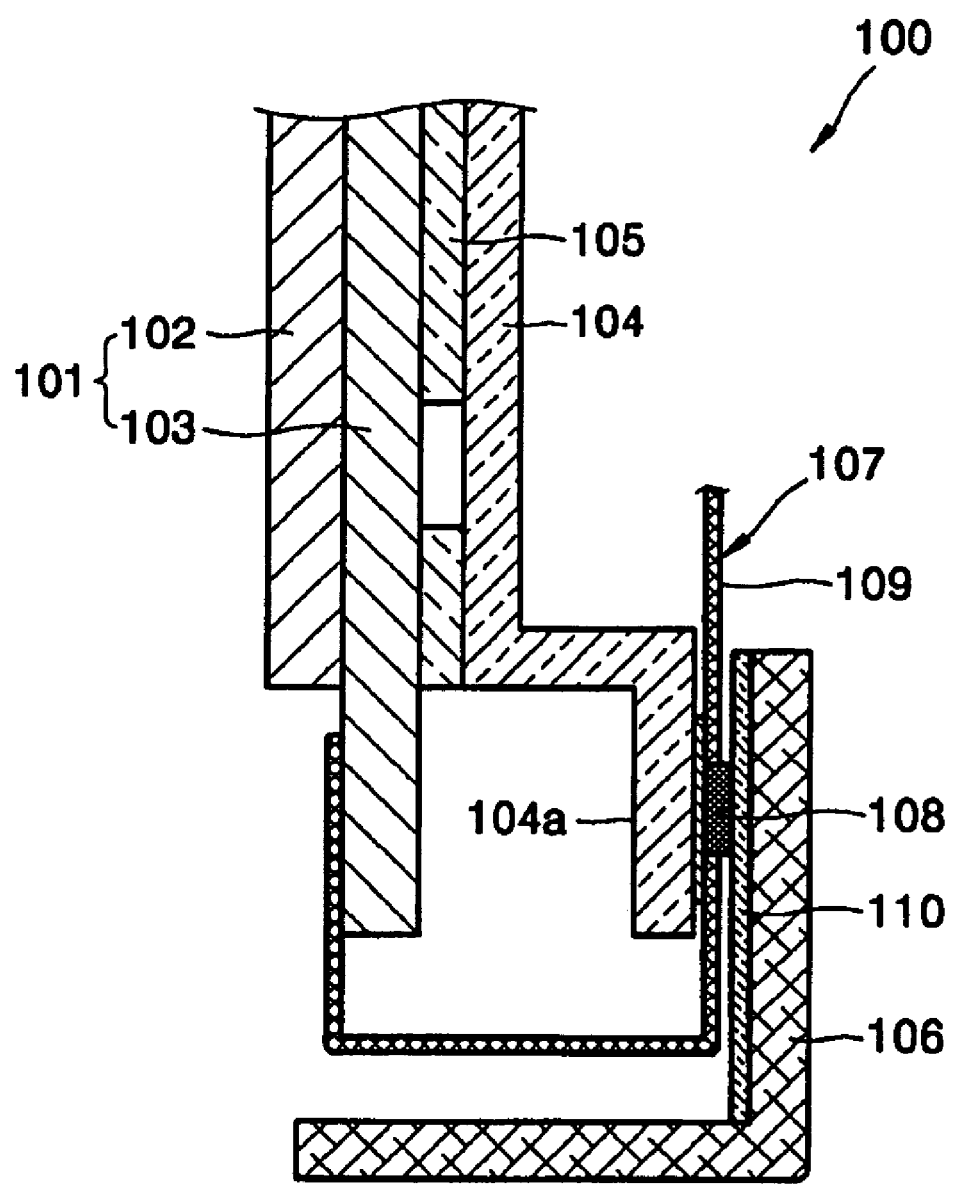
FIG. 1 is a sectional view of a portion of a conventional plasma display panel (PDP) assembly.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
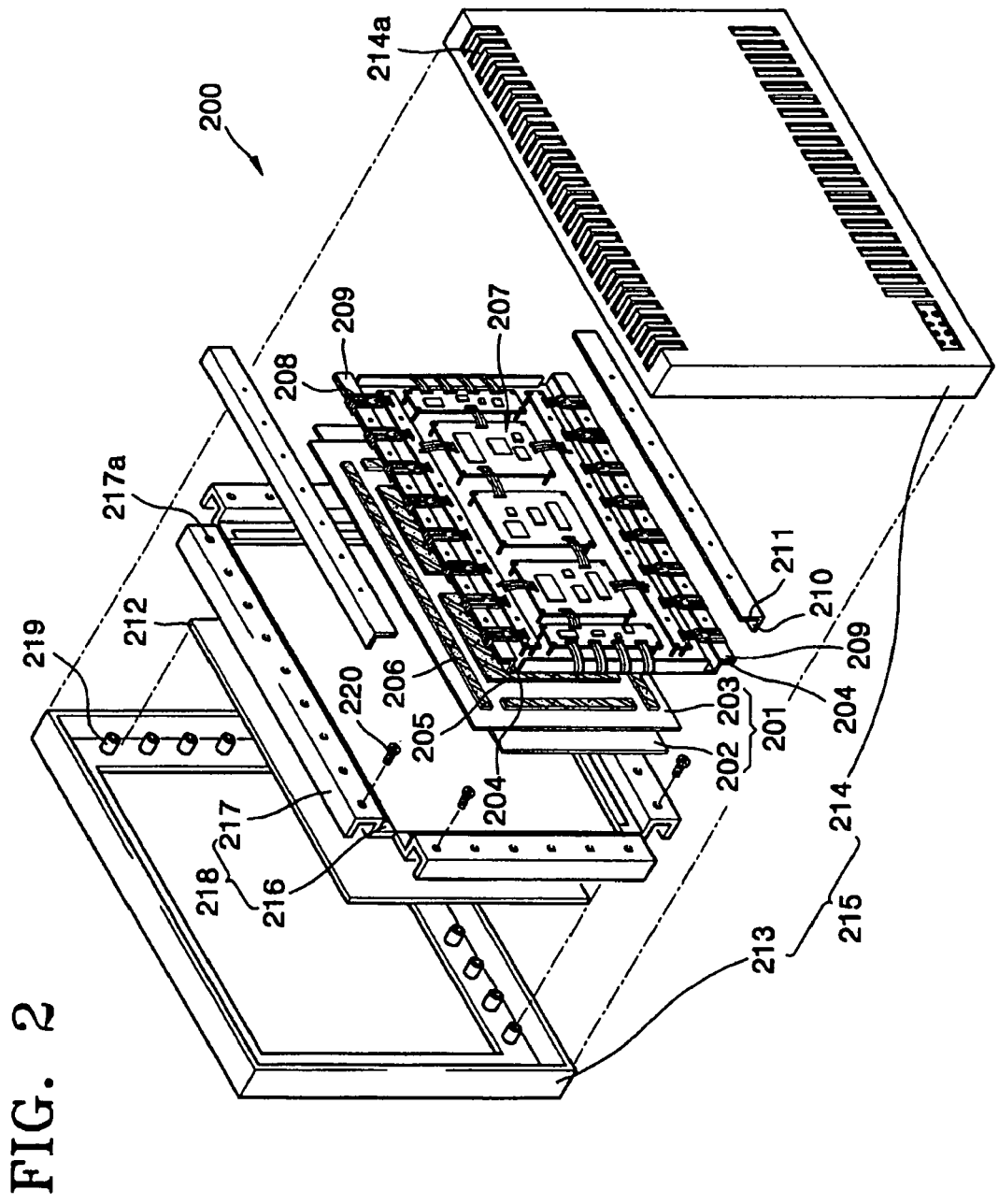
FIG. 2 is an exploded perspective view of a PDP assembly according to a first exemplary embodiment of the present invention.

FIG. 2 is an exploded perspective view of a plasma display panel (PDP) assembly 200 according to a first exemplary embodiment of the present invention.

Referring to FIG. 2, the PDP assembly 200 includes a PDP 201 having a front panel 202 and a rear panel 203 coupled with the front panel 202.

The front panel 202 may include pairs of sustain electrodes, a front dielectric layer covering the sustain electrode pairs, and a protective layer covering the front dielectric layer. The rear panel 203 may include address electrodes arranged substantially perpendicular to the sustain electrode pairs and a rear dielectric layer covering the address electrodes. Barrier ribs, which define discharge cells and preventing cross-talk, are arranged between the front and rear panels 202 and 203, and a red, green, or blue phosphor layer is coated inside the discharge cells.

A chassis base 204 is coupled with a rear surface of the PDP 201 by an adhesive member. The adhesive member includes a heat-dissipating sheet 205, which is arranged at a central portion of an outer surface of the rear panel 203, and double-sided tape 206, which is arranged at edges of the outer surface of the rear panel 203. The heat-dissipating sheet 205 may dissipate heat generated from the PDP 201 to the outside.

A driving circuit unit 207 is installed on the back of the chassis base 204. A plurality of circuit devices are mounted on the driving circuit unit 207, and a tape carrier package 208 is coupled with the driving circuit unit 207. The tape carrier package 208 is connected between electrode terminals and the driving circuit unit 207 to transmit electrical signals between them.

A filter assembly 212 is installed in the front of the PDP 201. The filter assembly 212 blocks electromagnetic waves, infrared rays or neon radiation produced by the PDP 201, as well as reflection of external light.

A case 215 houses the PDP 201, the chassis base 204, and the filter assembly 212. The case 215 includes a front cabinet 213, which is installed in front of the filter assembly 212, and a back cover 214, which is installed behind the chassis base 204. A plurality of vent holes 214a are formed in top and bottom portions of the back cover 214.

A filter holder 218 is installed behind the filter assembly 212. The filter holder 218 includes a pressing unit 216, which presses the filter assembly 212 against the front cabinet 213, and a fixing portion 217, which is bent from the pressing unit 216, against the front cabinet 213. A plurality of coupling holes 217a are formed in the fixing portion 217.

A filter installation unit 219 is mounted on the back of the front cabinet 213. The fixing portion 217 faces the filter installation unit 219, and screws 220 fix the filter assembly 212 to the front cabinet 213.

The PDP assembly 200 further includes a short circuit preventive unit 209 to quickly dissipate heat generated from a tape carrier package 208 to the outside and to prevent the tape carrier package 208 from short-circuiting.

The short circuit preventive unit is described below with reference to FIG. 3 and FIG. 4.

Figure 3:
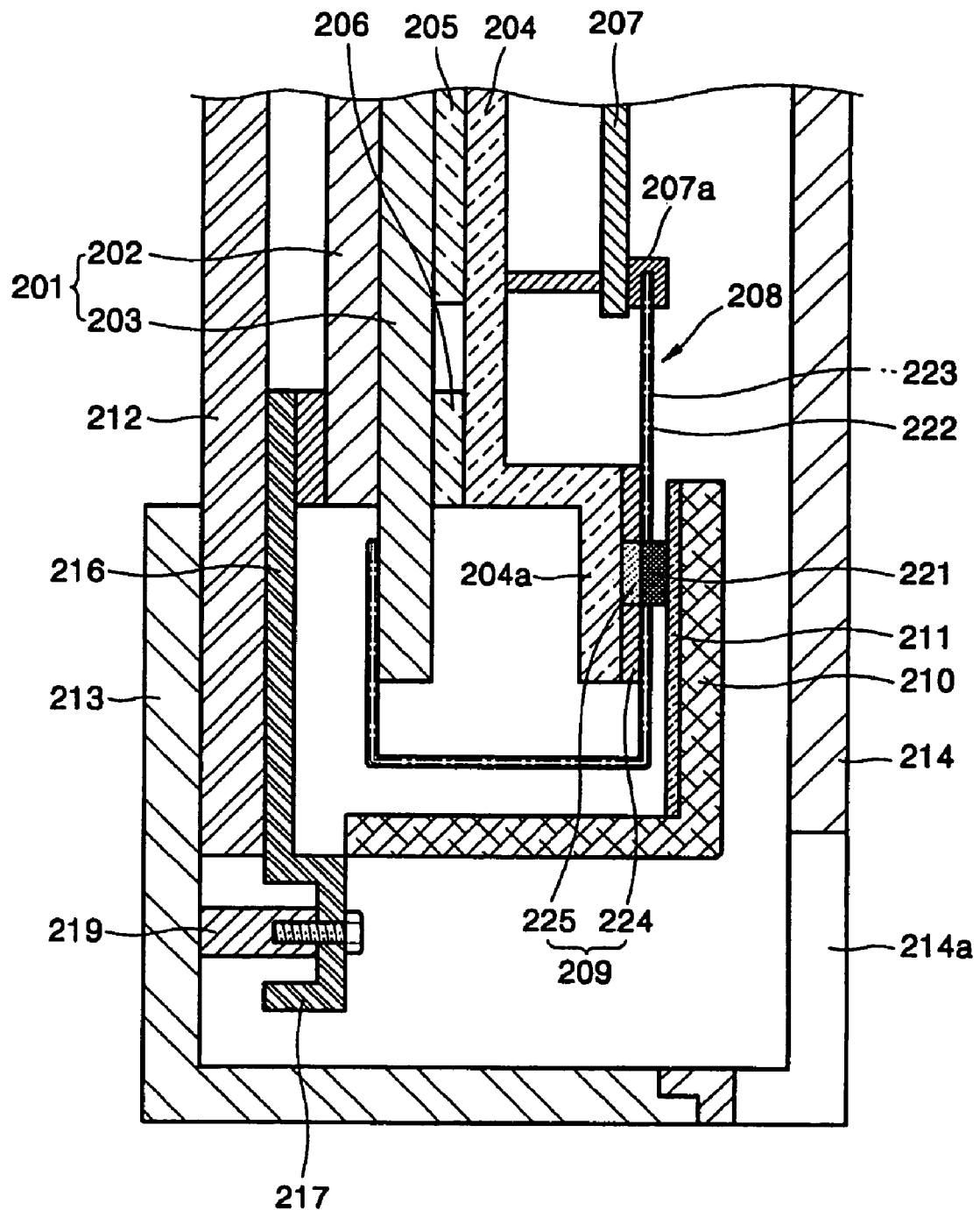
FIG. 3 is a sectional view of a portion of the PDP assembly of FIG. 2.

FIG. 3 is a sectional view of a portion of the PDP assembly 200 of FIG. 2. FIG. 4 is an enlarged view of the short circuit preventive unit 209 of FIG. 3.

Figure 4:
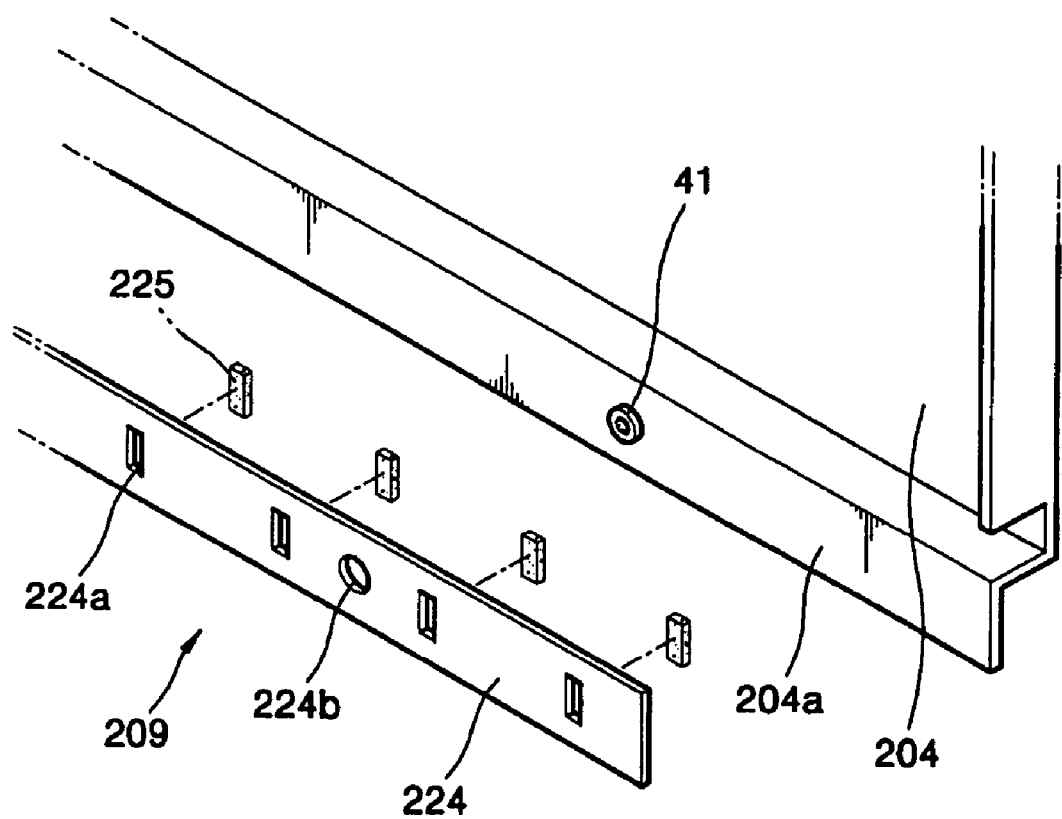
FIG. 4 is an enlarged view of a short circuit preventive unit of FIG. 3.

Referring to FIG. 3 and FIG. 4, the chassis base 204 is located behind the PDP 201. The heat-dissipating sheet 205 and the double-sided tape 206 are arranged between the PDP 201 and the chassis base 204. The chassis base 204 may be separated by a predetermined distance from the heat-dissipating sheet 205 rather than directly contacting the heat-dissipating sheet 205.

The chassis base 204 may be formed of highly heat-conductive metal, such as an aluminium alloy. An end 204a of the chassis base 204 is bent in an "L" shape in a direction away from the PDP 201. The driving circuit unit 207 is installed on the back of the chassis base 204.

The tape carrier package 208 is arranged between the driving circuit unit 207 and the PDP 201 to electrically connect an electrode terminal of the PDP 201 with a connector 207a installed on the driving circuit unit 207. One end of the tape carrier package 208 is coupled with an electrode terminal in the PDP 201, and the other end is coupled with the connector 207a of the driving circuit unit 207. The tape carrier package 208 includes a driving integrated circuit (IC) 221, a lead 223, which is electrically connected with each lead of the driving IC 221, and a flexible film 222 covering the lead 223.

The tape carrier package 208 is arranged between the end 204a of the chassis base 204 and a cover plate 210 arranged behind the end 204a. In other words, an end of the tape carrier package 208 is coupled with the PDP 201, and the other end of the tape carrier package 208 passes between the end 204a of the chassis base 204 and the cover plate 210 and is coupled with the connector 207a of the driving circuit unit 207.

The short circuit preventive unit 209 is arranged between the end 204a of the chassis base 204 and the tape carrier package 208 to prevent the tape carrier package 208 from being damaged and short circuiting.

Figure 7:
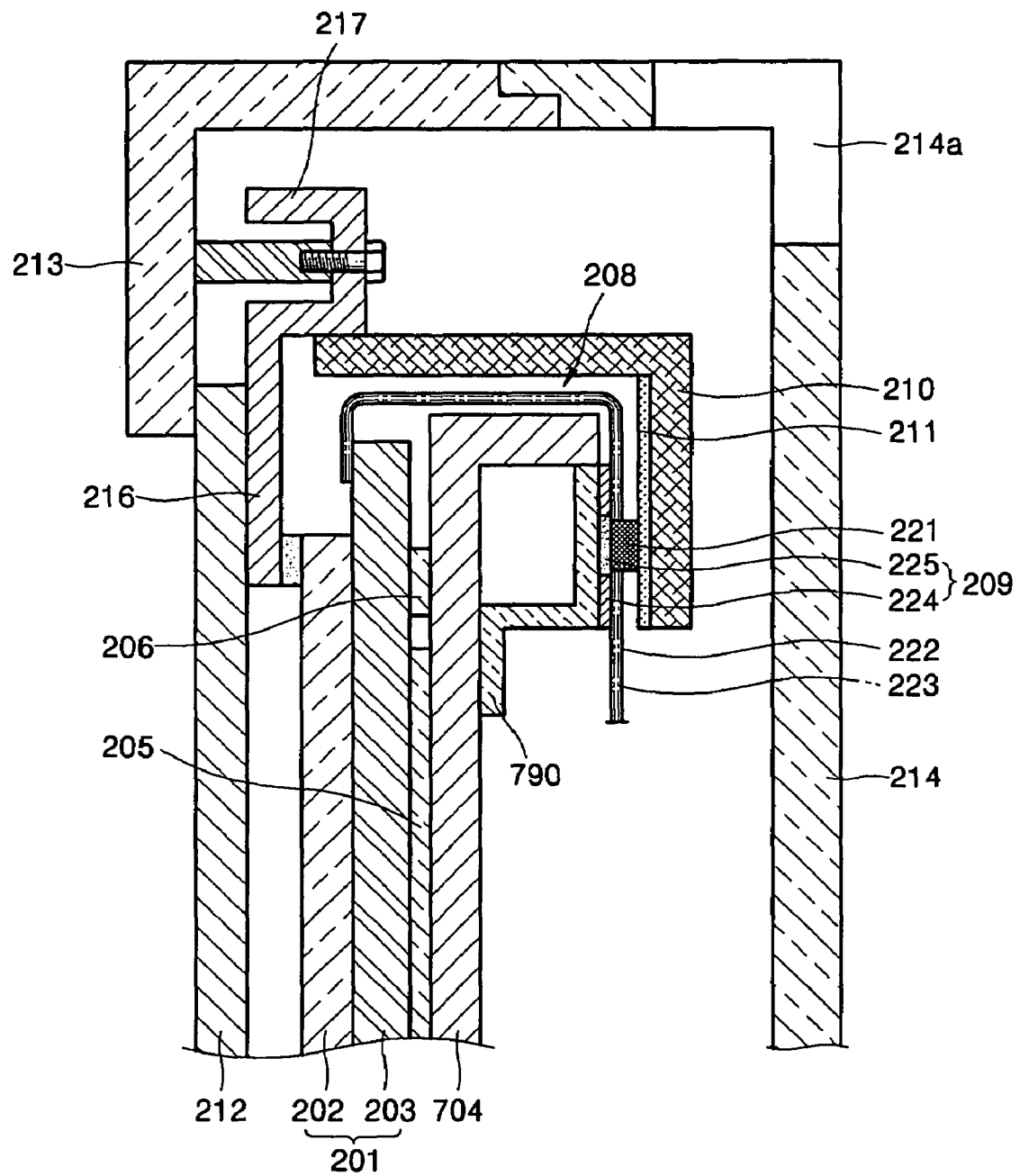
FIG. 7 is an exploded perspective view of a PDP assembly according to an exemplary embodiment of the present invention.

The short circuit preventive unit 209 includes a strip-type insulating plate 224 coupled with a surface of the end 204a of the chassis base 204 facing the tape carrier package 208. The insulating plate 224 may be formed of a flexible, insulating material, such as for example, a polymer film like PP, PE, LDPE, HDPE, PVC, PMMA, Polyimide, PEEK, or an elastic material like rubber. Additionally, the strip-shaped insulating plate 224 is arranged along a lengthwise direction of the chassis base 204. Alternatively, instead of forming the chassis base 204 with the end 204a, a reinforcing member may be coupled with, and protrude from, the chassis base. Referring to FIG. 7, a reinforcing member 790 is coupled with a chassis base 704. In this case, the insulating plate 224 may be coupled with a surface of the reinforcing member 790 that faces the tape carrier package 208.

Heat conductive mediums 225 are formed in the insulating plate 224 at positions corresponding to the driving ICs 221, and an outer surface of the driving IC 221 may directly contact the heat conductive medium 225. The heat conductive medium 225 may be adhered to an outer surface of the insulating plate 224. More preferably, as FIG. 3 and FIG. 4 show, the heat conductive mediums 225 may be arranged on the same level as (i.e. coplanar with) the insulating plate 224.

To this end, filling holes 224a, into which the heat conductive mediums 225 are inserted, are formed in the insulating plate 224 separated from each other at predetermined intervals. The filling holes 224a are intermittently formed along the insulating plate 224 at positions where the driving ICs 221 are arranged.

Solid heat conductive mediums 225 may be arranged in the filling holes 224a. Alternatively, after coupling the insulating plate 224 with the end 204a of the chassis base 204, a small droplet of liquid heat conductive mediums 225 may be placed in the filling holes 224a and solidified. The heat conductive mediums 225 may be formed of thermal grease.

A guide hole 224b may also be formed in the insulating plate 224. A guide unit 41 arranged on the end 204a of the chassis base 204 may be inserted into the guide hole 224b to align the insulating plate 224 with the chassis base 204.

A heat-dissipating sheet 211 is arranged between the tape carrier package 208 and the cover plate 210. The heat-dissipating sheet 211 is coupled with an inner surface of the cover plate 210, and it contacts the driving IC 221 when a predetermined pressure is applied to the outer surface of the driving IC 221. The heat-dissipating sheet 211 may be a silicon sheet.

As described above, the insulating plate 224 is arranged between the tape carrier package 208 and the end 204a of the chassis base 204, and the heat-dissipating sheet 211 is arranged between the tape carrier package 208 and the cover plate 210. Additionally, the heat conductive medium 225 contacts a first surface of the driving IC 221, and the heat-dissipating sheet 211 contacts a second surface of the driving IC 221.

In the PDP assembly 200 having such a structure, heat generated from the PDP 201 during its operation may be dissipated to the outside through the chassis base 204 via the heat-dissipating sheet 205.

Additionally, heat generated from the driving IC 221 of the tape carrier package 208 may be dissipated through the end 204a of the chassis base 204 via the heat conductive mediums 225, as well as through the cover plate 210 via the heat-dissipating sheet 211.

As the dissipated heat is cooled by the air flowing in from the outside through the vent holes 214a formed in the back cover 214, it flows from a lower portion to an upper portion of the case 215 by convection and is dissipated to the outside.

To fabricate the PDP assembly 200, the insulating plate 224 is coupled with the outer surface of the end 204a of the chassis base 204. The insulating plate 224 is aligned with the chassis base 204 using the guide hole 224b formed in the insulating plate 224 and the guide unit 41 protruding from the outer surface of the end 204a of the chassis base 204. Additionally, the heat conductive mediums 225 in a liquid state, for example, thermal grease, may spread and solidify inside the filling holes 224a of the insulating plate 224.

One end of the tape carrier package 208 is coupled with an electrode terminal of the PDP 201, and the other end is coupled with the connector 207a of the driving circuit unit 207. Here, a surface of the driving ICs 221 may contact outer surfaces of the heat conductive mediums 225.

To protect the tape carrier package 208, the cover plate 210 may be arranged to cover the tape carrier package 208 and the end 204a of the chassis base 204. Accordingly, the tape carrier package 208 is arranged between the end 204a of the chassis base 204 and the cover plate 210;

When the driving IC 221 is coupled with the heat-dissipating sheet 211, a predetermined compression pressure is applied to the other surface of the driving IC 221 to fix the driving IC 221 in its position.

While assembling the PDP assembly 200, the pressure applied to the driving IC 221 may increase when the chassis base 204 is transformed or bent by an external force. Even when this pressure increases, the lead 223 exposed after the film 222 is ripped may be prevented from short-circuiting since the insulating plate 224 is wide enough to cover the end 204a of the chassis base 204.

Figure 5:
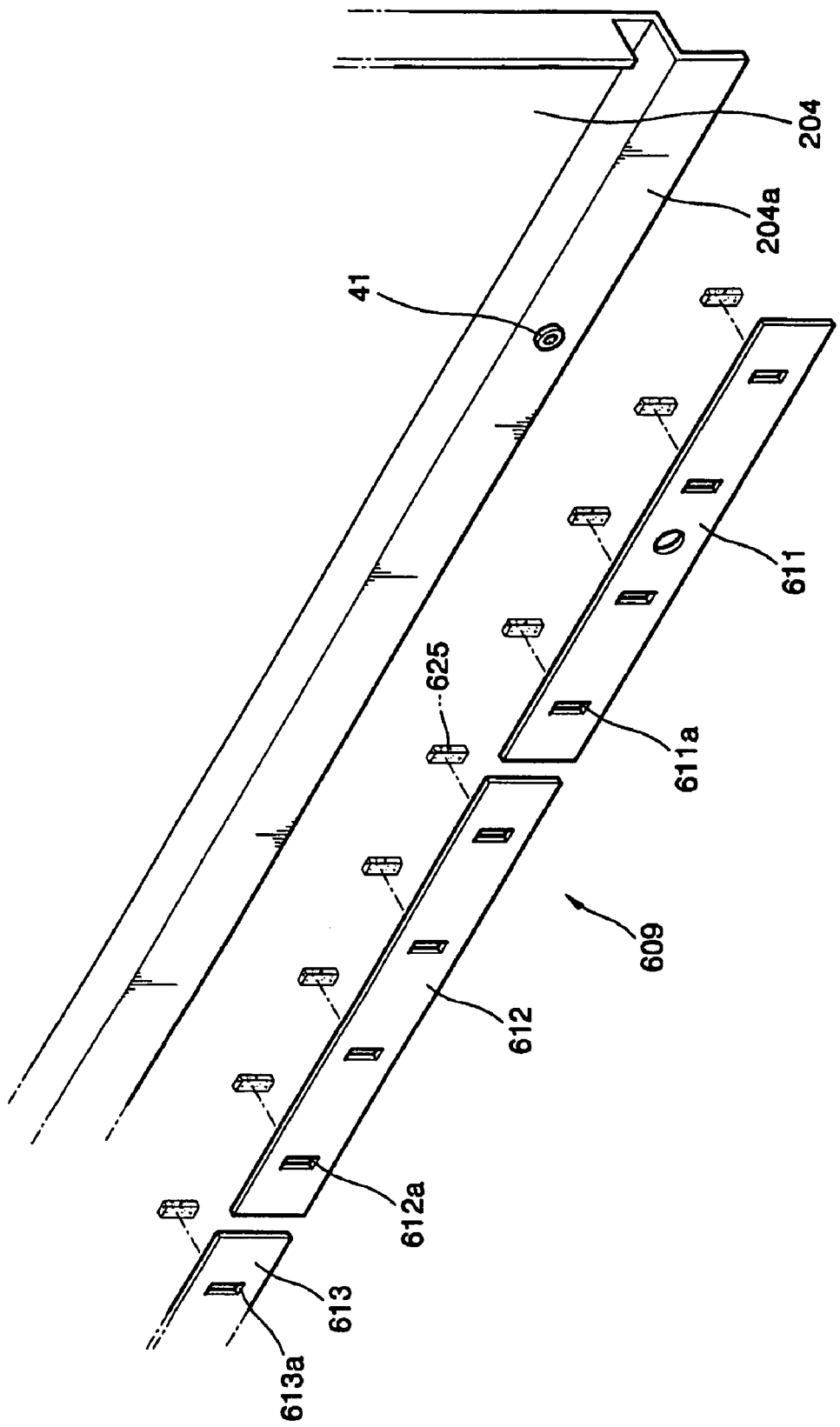
FIG. 5 is an exploded perspective view of a short circuit preventive unit according to a second exemplary embodiment of the present invention.

FIG. 5 is an exploded perspective view of a short circuit preventive unit 609 according to a second exemplary embodiment of the present invention. Here, like reference numerals in the previous drawings denote like elements.

Referring to FIG. 5, the end 204a of the chassis base 204 is bent toward the short circuit preventive unit 609 at a predetermined angle. The short circuit preventive unit 609 is coupled with an outer surface of the end 204a. The short circuit preventive unit 609 includes first, second, and third insulating plates 611, 612, and 613 arranged along a lengthwise direction of the chassis base 204.

In other words, the first insulating plate 611, the second insulating plate 612 separated from the first insulating plate 611, and the third insulating plate 613 separated from the second insulating plate 612, are continuously disposed. A length and number of such insulating plates may be set arbitrarily.

First filling holes 611a are formed in the first insulating plate 611 and are separated from each other at predetermined intervals, second filling holes 612a are formed in the second insulating plate 612 and are separated from each other at predetermined intervals, and third filling holes 613a are formed in the third insulating plate 613 and are separated from each other at predetermined intervals.

Heat conductive mediums 625, such as thermal grease, are arranged in the first, second, and third filling holes 611a, 612a, and 613a, and the heat conductive mediums 625 are positioned corresponding to the driving ICs 221 of the tape carrier packages 208 of FIG. 3.

Figure 6:
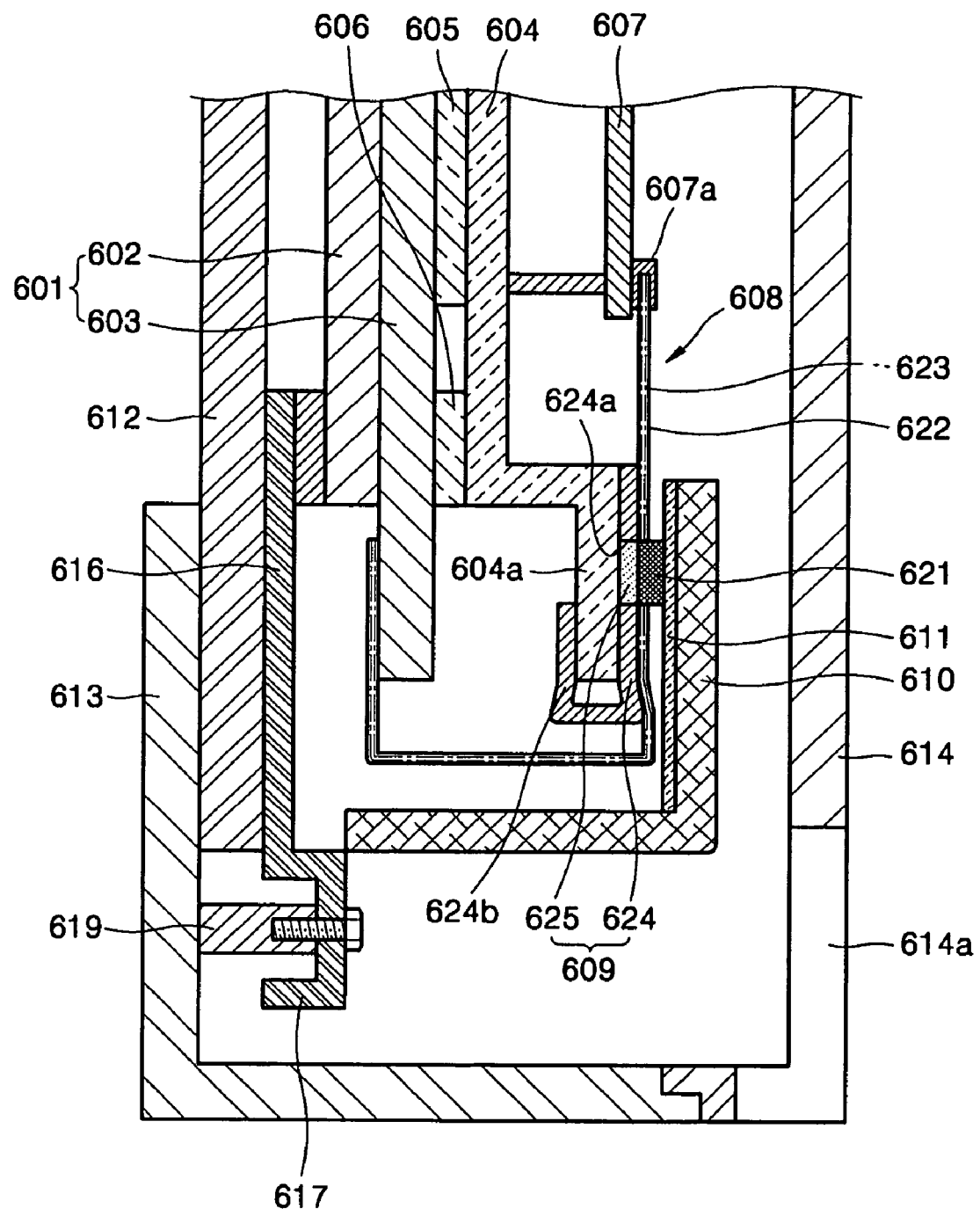
FIG. 6 is a sectional view of a portion of a PDP assembly according to a third exemplary embodiment of the present invention.

FIG. 6 is a sectional view of a portion of a PDP assembly according to a third exemplary embodiment of the present invention.

Referring to FIG. 6, the PDP assembly includes a PDP 601 having a front panel 602 and a rear panel 603 coupled with the front panel 602, a chassis base 604 coupled with the back of the PDP 601, and a driving circuit unit 607 coupled with the back of the chassis base 604.

An adhesive member is arranged between the PDP 601 and the chassis base 604 and includes a heat-dissipating sheet 605, which is arranged at a central portion of an outer surface of the rear panel 603, and double-sided tape 606, which is arranged at edges of the outer surface of the rear panel 603.

A filter assembly 612 is installed in front of the PDP 601, and a front cabinet 613 is coupled with the filter assembly 612. A back cover 614 is coupled with the front cabinet 613, and together they house the filter assembly 612, the PDP 601, the chassis base 604, and the driving circuit unit 607. A plurality of vent holes 614a, through which air flows in and out, are formed in the back cover 614.

A pressing unit 616 presses the filter assembly 612 against the front cabinet 613. A fixing portion 617 bent from the pressing unit 616 toward the front cabinet 613 is coupled with a filter installation unit 619, which is mounted on the back of the front cabinet 613, by screws such that the filter assembly 612 is fixed to the front cabinet 613.

A cover plate 610 is arranged behind and on a side of the chassis base 604 (i.e. it partially surrounds top and bottom portions of the chassis base 604), and it is separated from the chassis base 604 by a predetermined distance. The strip-shaped heat-dissipating sheet 611, which may be a silicon sheet, is coupled with an inner surface of the cover plate 610 along a lengthwise direction of the cover plate 610.

A tape carrier package 608 is arranged between an end 604a of the chassis base 604 and the cover plate 610. The tape carrier package 608 includes a driving IC 621, a plurality of leads 623 coupled with the driving IC 621, and a flexible film 62 covering the leads 623.

An end of each of the leads 623 in the tape carrier package 608 is electrically connected to electrode terminals of the PDP 601, and the other end of each of the leads 623 is electrically connected to a connector 607a of the driving circuit unit 607.

The short circuit preventive unit 609 is arranged between the end 604a of the chassis base 604 and the tape carrier package 608. The short circuit preventive unit 609 includes strip-shaped insulating plate 624 and the heat conductive mediums 625 arranged in filling holes 624a in the insulating plate 624. The insulating plate 624 is coupled with an outer surface of the end 604a of the chassis base 604, and the heat conductive mediums 625 contact the driving IC 621.

A lower portion of the insulating plate 624, in a lengthwise direction thereof, is folded to form an insertion portion 624b, which accommodates both sides of the end 604a of the chassis base 604. Since the insulating plate 624 is formed of an elastic material, the end 604a may be inserted into the insertion portion 624a.

In a PDP assembly having such a structure, heat generated from the driving ICs 621 may be dissipated through the end 604a of the chassis base 604 via the heat conductive mediums 625 of the short circuit preventive unit 609 and, at the same time, through the cover plate 610 via the heat-dissipating sheet 611 facing the end 604a.

A PDP assembly according to exemplary embodiments of the present invention may achieve the following effects.

Since an insulating short circuit preventive unit is arranged between a chassis base and a tape carrier package, a film of the tape carrier package may be prevented from being damaged. Accordingly, a short circuit caused when a lead contacts the chassis base may be prevented in advance.

Even if the film is damaged by a bur remaining during the fabrication of the chassis base, a short circuit may be prevented.

Also, since heat conductive mediums are arranged in the short circuit preventive unit at positions corresponding to driving ICs, heat generated from the driving IC may be quickly dissipated via the chassis base. Accordingly, a running temperature of the driving IC may be maintained at an appropriate level, thereby enhancing the driving IC's reliability.

Further, since the heat conductive mediums of the short circuit preventive unit may be arranged in filling holes of an insulating plate, the heat conductive mediums may be on the same level as the insulating plate. Consequently, an external force applied to the PDP assembly while it is assembled may be evenly distributed.

Additionally, at least one short circuit preventive unit may be arranged on an outer surface of the chassis base. In other words, the number of short circuit preventive units may be adjusted according to the PDP assembly's size.

Furthermore, the insulating plate of the short circuit unit may be formed with an insertion portion, into which an end of the chassis base may be inserted. Hence, damage to the tape carrier package film caused by edges of the end may be prevented.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display panel (PDP) assembly, comprising: a PDP; a chassis base supporting the PDP; a driving circuit unit coupled with a rear surface of the chassis base; a tape carrier package electrically coupling the PDP with the driving circuit unit, and comprising a driving integrated circuit (IC); and a short circuit preventive unit arranged between the chassis base and the tape carrier package and preventing the tape carrier package from short-circuiting, the short circuit preventive unit having a uniform thickness in a direction perpendicular to the PDP, wherein the short circuit preventive unit comprises an insulating plate comprising a flexible, insulating film, wherein the short circuit preventive unit further comprises a heat conductive medium arranged in the insulating plate at a position corresponding to the driving IC, and wherein the heat conductive medium is arranged in a hole in the insulating plate such that the heat conductive medium is arranged on substantially the same level as the insulating plate.

2. The PDP assembly of claim 1, wherein the insulating plate comprises a strip-shape insulating plate coupled with an outer surface of a portion of the chassis base facing the tape carrier package.

3. The PDP assembly of claim 1, wherein the heat conductive medium comprises thermal grease.

4. A plasma display panel (PDP) assembly, comprising:
a PDP;
a chassis base supporting the PDP;
a driving circuit unit coupled with a rear surface of the chassis base;
a tape carrier package electrically coupling the PDP with the driving circuit unit, and comprising a driving integrated circuit (IC); and
a short circuit preventive unit arranged between the chassis base and the tape carrier package and preventing the tape carrier package from short-circuiting,
wherein the short circuit preventive unit comprises a strip-shape insulating plate coupled with an outer surface of a portion of the chassis base facing the tape carrier package, and
wherein a lower portion of the insulating plate comprises an insertion unit, an end of the chassis base being arranged within the insertion unit.

5. The PDP assembly of claim 2, wherein at least one sheet of the insulating plate is continuously arranged along a lengthwise direction of the chassis base.

6. The PDP assembly of claim 1, further comprising:
a cover plate for protecting the tape carrier package,
wherein the tape carrier package is arranged between the chassis base and the cover plate.

7. The PDP assembly of claim 6, further comprising a heat-dissipating sheet arranged between the tape carrier package and the cover plate.

8. The PDP assembly of claim 2, wherein the insulating plate is coupled with a reinforcing member, the reinforcing member protruding from, and coupled with, the chassis base.

9. A plasma display panel (PDP) assembly, comprising:
a chassis base supporting a PDP;
a cover plate arranged behind and on a side of the chassis base to be separated from the chassis base by a predetermined distance;
a tape carrier package arranged between the chassis base and the cover plate, and comprising a driving integrated circuit (IC); and
a short circuit preventive unit arranged between the chassis base and the tape carrier package and preventing the tape carrier package from short-circuiting, the short circuit preventive unit having a uniform thickness in a direction perpendicular to the PDP,
wherein the short circuit preventive unit comprises an insulating plate comprising a flexible, insulating film, and
wherein the insulating plate comprises a hole at a position corresponding to the driving IC, and a heat conductive medium is arranged in the hole.

10. The PDP assembly of claim 9, wherein the insulating plate comprises a strip-shape insulating plate coupled with an outer surface of a portion of the chassis base facing the tape carrier package.

11. The PDP assembly of claim 10, wherein the insulating plate is coupled with a reinforcing member, the reinforcing member protruding from, and coupled with, the chassis base.

12. The PDP assembly of claim 1, wherein the driving circuit unit is separated from the chassis base by a predetermined distance.

* * * * *

UNITED STATES PATENT AND TRADEMARK OFFICE
CERTIFICATE OF CORRECTION

| | |
|---|---|
| PATENT NO. | : 7,605,525 B2 |
| APPLICATION NO. | : 11/270466 |
| DATED | : October 20, 2009 |
| INVENTOR(S) | : Myoung-Kon Kim |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 769 days.

Signed and Sealed this

Fifth Day of October, 2010

David J. Kappos
*Director of the United States Patent and Trademark Office*